(12) United States Patent
Stone et al.

(10) Patent No.: US 10,942,203 B2
(45) Date of Patent: Mar. 9, 2021

(54) VOLTAGE PROBE CONFIGURED TO MEASURE VOLTAGE ON A MECHANICAL DEVICE BEFORE AND AFTER DISCHARGING VOLTAGE FROM THE MECHANICAL DEVICE

(71) Applicant: HELWIG CARBON PRODUCTS, INC., Milwaukee, WI (US)

(72) Inventors: Brian David Stone, Kewaskum, WI (US); Randall Scott Herche, Oconomowoc, WI (US); Nitin Diwakar Kulkarni, Menomonee Falls, WI (US)

(73) Assignee: HELWIG CARBON PRODUCTS, INC., Milwaukee, WI (US)

( * ) Notice: Subject to any disclaimer, the term of this patent is extended or adjusted under 35 U.S.C. 154(b) by 119 days.

(21) Appl. No.: 16/265,743

(22) Filed: Feb. 1, 2019

(65) Prior Publication Data

US 2019/0391188 A1 Dec. 26, 2019

Related U.S. Application Data

(60) Provisional application No. 62/687,399, filed on Jun. 20, 2018.

(51) Int. Cl.
*G01R 19/165* (2006.01)
(52) U.S. Cl.
CPC ............... *G01R 19/16576* (2013.01)
(58) Field of Classification Search
CPC ........ H02H 3/14; H02K 11/00; H02K 5/1732; H02K 11/40; H02K 47/14; G05B 23/0235; G05B 2219/50137; G05B 2219/42328; G05B 2219/50186; G01R 31/343; G01R 19/25; G01R 19/16576; G01R 31/02; G01R 19/165; G01R 190/04; G01R 1/06

USPC .......................................................... 324/149
See application file for complete search history.

(56) References Cited

U.S. PATENT DOCUMENTS

| | | | | |
|---|---|---|---|---|
| 6,091,236 A | * | 7/2000 | Piety ................. | G01R 31/343 324/103 P |
| 7,034,706 B1 | * | 4/2006 | Nippes ............... | G01R 31/343 340/635 |
| 7,102,379 B2 | * | 9/2006 | Hobelsberger ..... | G01R 31/1227 324/765.01 |
| 7,479,710 B2 | * | 1/2009 | Flock ................. | H02H 1/003 307/9.1 |
| 9,281,770 B2 | * | 3/2016 | Wood ................. | B25F 5/00 |

(Continued)

OTHER PUBLICATIONS

Inpro/Seal, "Smart Ground Monitor" https://www.inpro-seal.com/en_US/system-and-bearing-protection/shaft-grounding-solutions/smart-shaft-grounding/smart-ground-monitor/, Wepage available at least as early as 2010.

*Primary Examiner* — Vinh P Nguyen
(74) *Attorney, Agent, or Firm* — Michael Best & Friedrich LLP

(57) ABSTRACT

A voltage probe for measuring voltage on a mechanical device. The voltage probe includes a sensing brush, a grounding brush, a grounding switch, and an electronic processor. The electronic processor is configured to receive a voltage from the sensing brush and, after a change of state of the grounding switch, which electrically connects the grounding brush to a mechanical device, measure voltage on the mechanical device, compare the measured voltage to a predetermined threshold, and generate an electronic signal indicative of the measured voltage or the comparison.

20 Claims, 14 Drawing Sheets

(56) References Cited

U.S. PATENT DOCUMENTS 10,562,116 B2 * 2/2020 Dey, IV ............... B23D 59/001
2017/0285086 A1 * 10/2017 Thompson ............. G01R 31/50

* cited by examiner

VOLTAGE PROBE CONFIGURED TO MEASURE VOLTAGE ON A MECHANICAL DEVICE BEFORE AND AFTER DISCHARGING VOLTAGE FROM THE MECHANICAL DEVICE

RELATED APPLICATIONS

This application claims priority to U.S. Provisional Patent Application No. 62/687,399, filed Jun. 20, 2018, the entire content of which is hereby incorporated by reference.

BACKGROUND

The embodiments herein relate to a voltage probe for measuring and discharging voltage on a mechanical device.

SUMMARY

Sometimes, during the operation of a motor, voltage builds up on the drive shaft of the motor. As a result, current dissipates from the motor shaft through one or more bearings connected to the motor shaft. The dissipation of current through the shaft bearings causes premature wearing on the bearings. Therefore, there is a need to discharge the voltage from the motor shaft to reduce the risk of potential failure due to electrical discharges. This can be accomplished by means of a bearing protector kit. A bearing protector kit may be mounted to a housing of the motor and include a brush that is in contact with the motor shaft as the shaft turns. The brush in the bearing protector kit is grounded and therefore the voltage on the motor shaft discharges through the brush to ground rather than through the bearings.

It may be desirable to assess (in, for example, a manufacturing facility) whether voltage is building up on a motor shaft to determine whether installing a bearing protection kit on the motor housing will discharge the voltage and protect the bearings. Therefore, embodiments described herein provide a voltage probe for measuring voltage on a motor shaft and simulating the effect that installing a bearing protector kit would have on the voltage of the shaft.

One embodiment provides a voltage probe. The voltage probe includes a sensing brush, a grounding brush, a grounding switch, and an electronic processor. The electronic processor is configured to receive a voltage from the sensing brush and, after a change of state of the grounding switch, which electrically connects the grounding brush to a mechanical device, measure voltage on the mechanical device, compare the measured voltage to a predetermined threshold, and generate an electronic signal indicative of the measured voltage or the comparison.

Another embodiment provides a method of using a voltage probe to measure voltage on a mechanical device. The method includes receiving a voltage from a sensing brush and, after a change of state of a grounding switch, which electrically connects a grounding brush to the mechanical device, measuring, with an electronic processor, voltage on the mechanical device, comparing the measured voltage to a predetermined threshold, and generating an electronic signal indicative of the measured voltage or the comparison.

Yet another embodiment provides a voltage probe. The voltage probe includes a sensing brush, a grounding brush, a grounding switch, and an electronic processor. The electronic processor is configured to, receive a voltage from the sensing brush and, after a change of state of the grounding switch, which electrically connects the grounding brush to a mechanical device, measure voltage on the mechanical device, and generate an electronic signal indicative of the measured voltage.

Other aspects of the embodiments will become apparent by consideration of the detailed description and accompanying drawings.

DETAILED DESCRIPTION

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Figure 1:
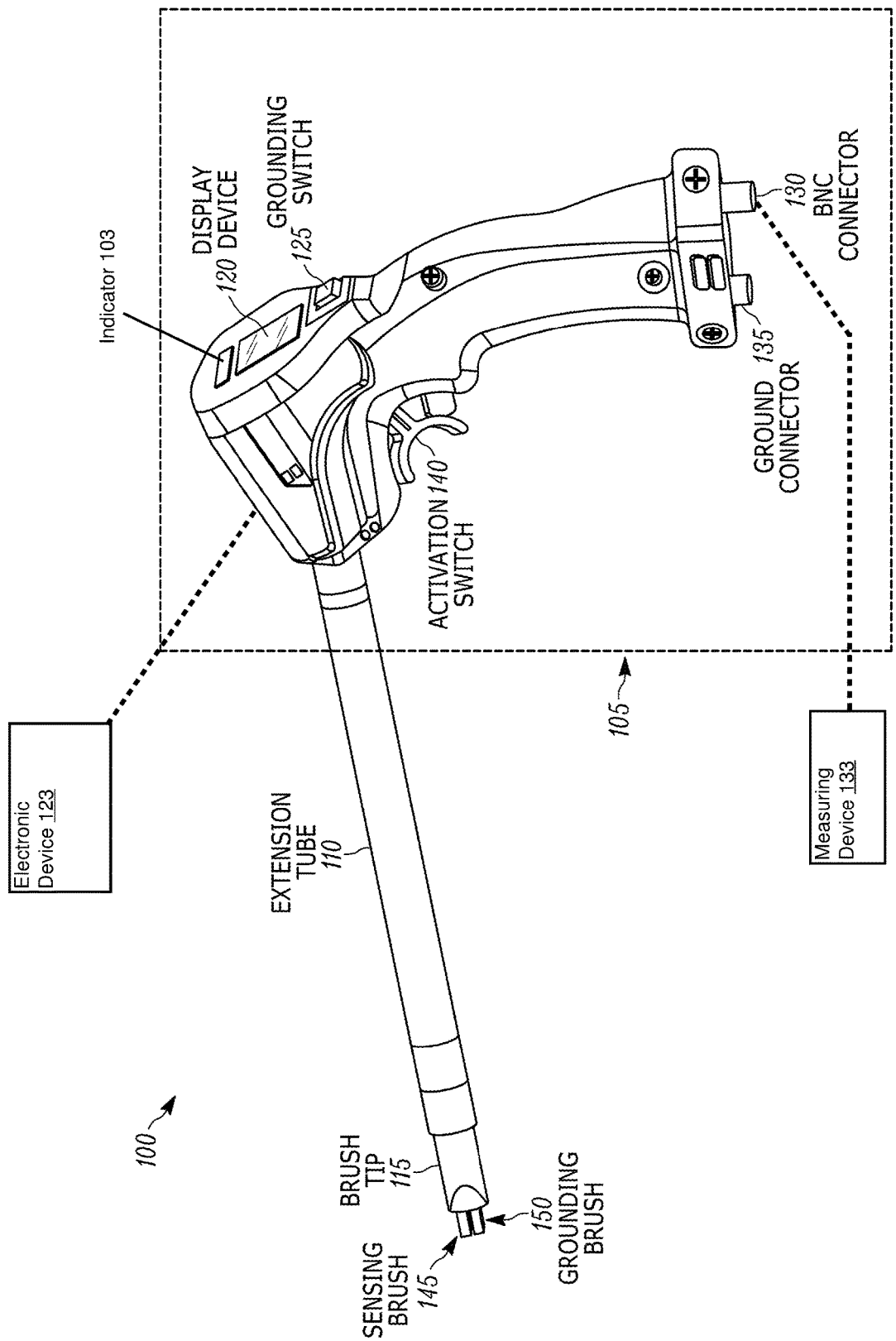
FIG. 1 illustrates a voltage probe configured to measure voltage on a motor shaft and discharge the voltage on the motor shaft.
Figure 2:
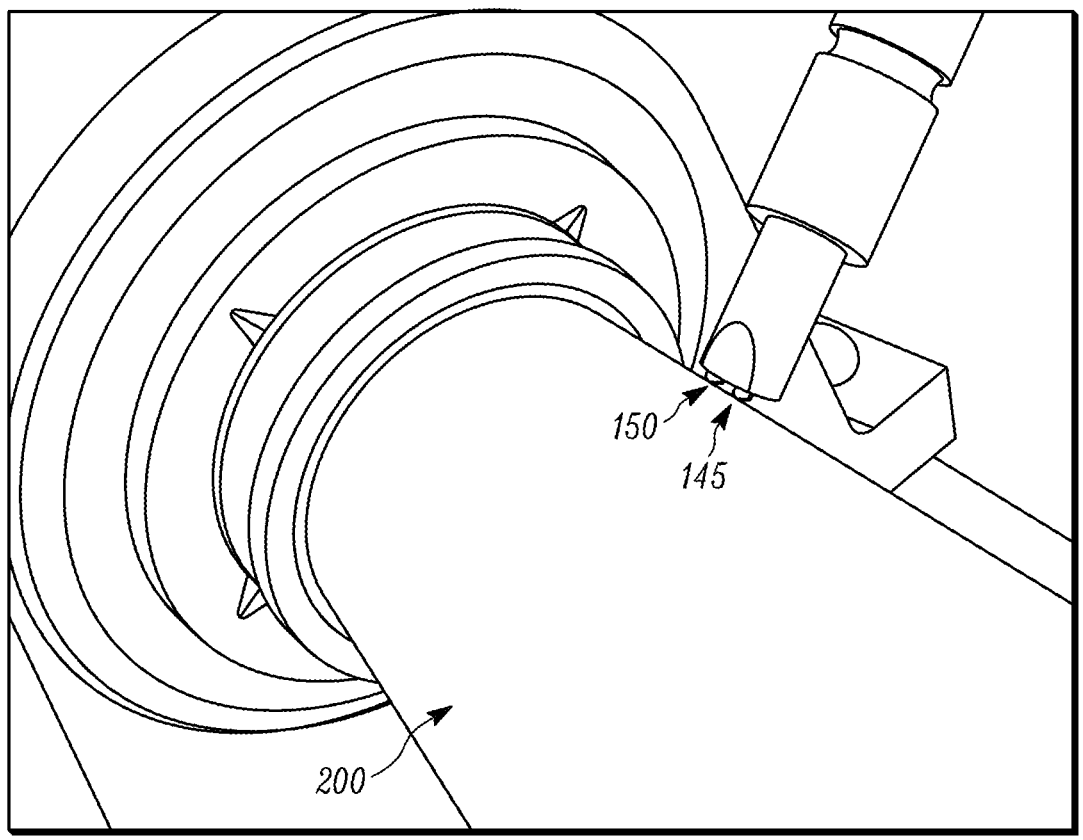
FIG. 2 illustrates a brush tip of the voltage probe of FIG. 1 in contact with a motor shaft.

FIG. 1 illustrates a voltage probe 100 configured to measure voltage on a motor shaft and selectively discharge the voltage on the motor shaft. The voltage probe 100 includes a voltage probe handle 105, an extension tube 110, and a brush tip 115. In one embodiment, the voltage probe handle 105 includes a display device 120, a grounding switch 125, a BNC (Bayonet Neill-Concelman) connector 130, a ground connector 135, an activation switch 140, and the like. The display device 120 may be, for example, a touchscreen, a liquid crystal display ("LCD"), a light-emitting diode ("LED"), a LED display, an organic LED ("OLED") display, an electroluminescent display ("ELD"), and the like. In some embodiments, the grounding switch 125 is a rocker switch that electrically connects the grounding brush 150 to the motor shaft. In some embodiments, the voltage probe 100 includes an indicator 103, such as an LED, that informs a user when the grounding switch 125 is open and when the grounding switch 125 is closed. As described in further detail below, the brush tip 115 includes two brushes (a sensing brush 145 and a grounding brush 150). In the illustrated embodiment, the sensing brush 145 and the grounding brush 150 are silver graphite brushes that are spring loaded and extend from a brush housing included in the brush tip 115. The sensing brush 145 and the grounding brush 150 may be brought into contact with a motor shaft. For example, the sensing brush 145 and the grounding brush 150 may be brought into contact with a motor shaft 200, illustrated in FIG. 2. While a motor shaft is used as an example in the embodiments described herein, it should be understood that the voltage probe 100 may be used to measure and selectively discharge voltage on other rotating or stationary mechanical devices such as generator shafts, slip rings, and the like. It should be understood that in some embodiments, the voltage probe 100 may not include the extension tube 110 illustrated in FIG. 1.

Figure 3:
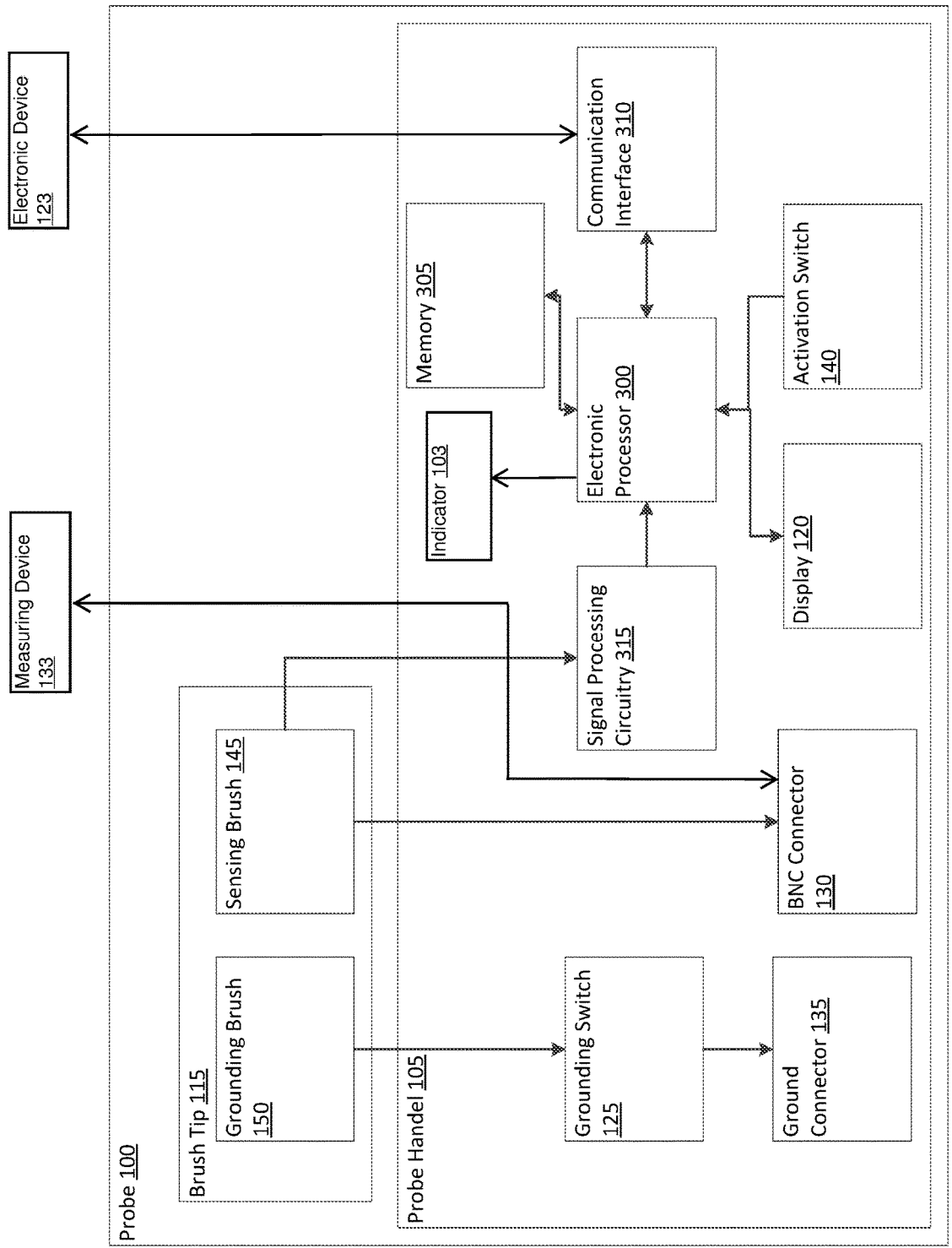
FIG. 3 illustrates a block diagram of the electronic components of the voltage probe of FIG. 1

FIG. 3 is a block diagram illustrating the electronic components and connections included in the voltage probe 100. As illustrated in FIG. 3, the voltage probe 100 includes an electronic processor 300 (for example, a microprocessor, application-specific integrated circuit (ASIC), or another suitable electronic device), a memory 305 (a non-transitory, computer-readable storage medium), and a communication interface 310 (such as a transceiver, for communicating over the one or more communication networks or connections or a connector/port for communicating via a wired connection). The electronic processor 300 is connected to the memory 305, the communication interface 310, the activation switch 140 and the display device 120, wirelessly or via one or more wired connections. The electronic processor 300 is also connected to the sensing brush 145 via signal processing circuitry 315. The signal processing circuitry 315 is configured to perform filtering and conditioning on a signal indicating the voltage on the motor shaft received from the sensing brush 145 and send the filtered and conditioned signal to the electronic processor 300. The electronic processor 300 is configured to determine whether the voltage on the motor shaft is above a predetermined threshold (which may be stored in the memory 305) and generate an electronic signal to transmit to the display device 120. When the display device 120 receives the electronic signal from the electronic processor 300, the display device 120 generates a visual indication based on the electronic signal and signifying whether the measured voltage is above, below, or equal to the predetermined threshold. The visual indication that the electronic processor 300 generates for display on the display device 120 depends on whether the voltage is determined to be less than, greater than, or equal to the predetermined threshold. In some embodiments, the display device 120 may be a graphical user interface. In other embodiments, the display device 120 may simply be a light such as an LED or a pair or series of LEDs. In one embodiment, an LED is illuminated to indicate whether the measured voltage is below the threshold. In another embodiment, a green LED is illuminated when the measured voltage is below the predetermined threshold and a red LED is illuminated when it is not. In some embodiments, in addition to or instead of transmitting the electronic signal to the display device 120, the electronic processor 300 may be configured to transmit the electronic signal to an electronic device 123 (such as such as laptop computers, tablets, mobile devices, and the like) via the communication interface 310. The electronic signal that the electronic processor 300 sends to the electronic device may be indicative of the measured voltage of the motor shaft. For example, whether the voltage on the motor shaft is greater than, less than, or equal to the predetermined threshold, and the like.

In addition to being connected to the signal processing circuitry 315, the sensing brush 145 is also connected to the BNC connector 130. The BNC connector 130 allows an oscilloscope 133 (and, in some embodiments, other devices such as other measurement or analysis instruments, identified generally as 133) to be connected to the voltage probe 100. The grounding brush 150 is connected to the ground connector 135 when the grounding switch 125 is closed.

It should be noted that, in the illustrated embodiments, the sensing brush 145 is connected to the signal processing circuitry 315 and the BNC connector 130 via one or more dedicated wires that travel from the brush tip 115 to the voltage probe handle 105 (in some embodiments, via the extension tube 110). Likewise, the grounding brush 150 is connected to the ground connector 135 via one or more dedicated wires that travel from the brush tip 115 to the voltage probe handle 105 (in some embodiments, via the extension tube 110). In use, the ground connector 135 is connected to an earth ground using an external cable (not shown). In some embodiments, wires connected to the sensing brush 145 or the grounding brush 150 are kept separate in the extension tube 110. Additionally, it should be understood that the voltage probe 100 may include additional components than those illustrated in FIG. 1 and FIG. 3 in various configurations and may perform additional functionality than the functionality described in the present application. It should also be understood that one or more of the components included in the voltage probe 100 may be connected to the ground connector 135. For example, the electronic processor 300 and the signal processing circuitry 315 may also be connected to the ground connector 135.

Figure 4:
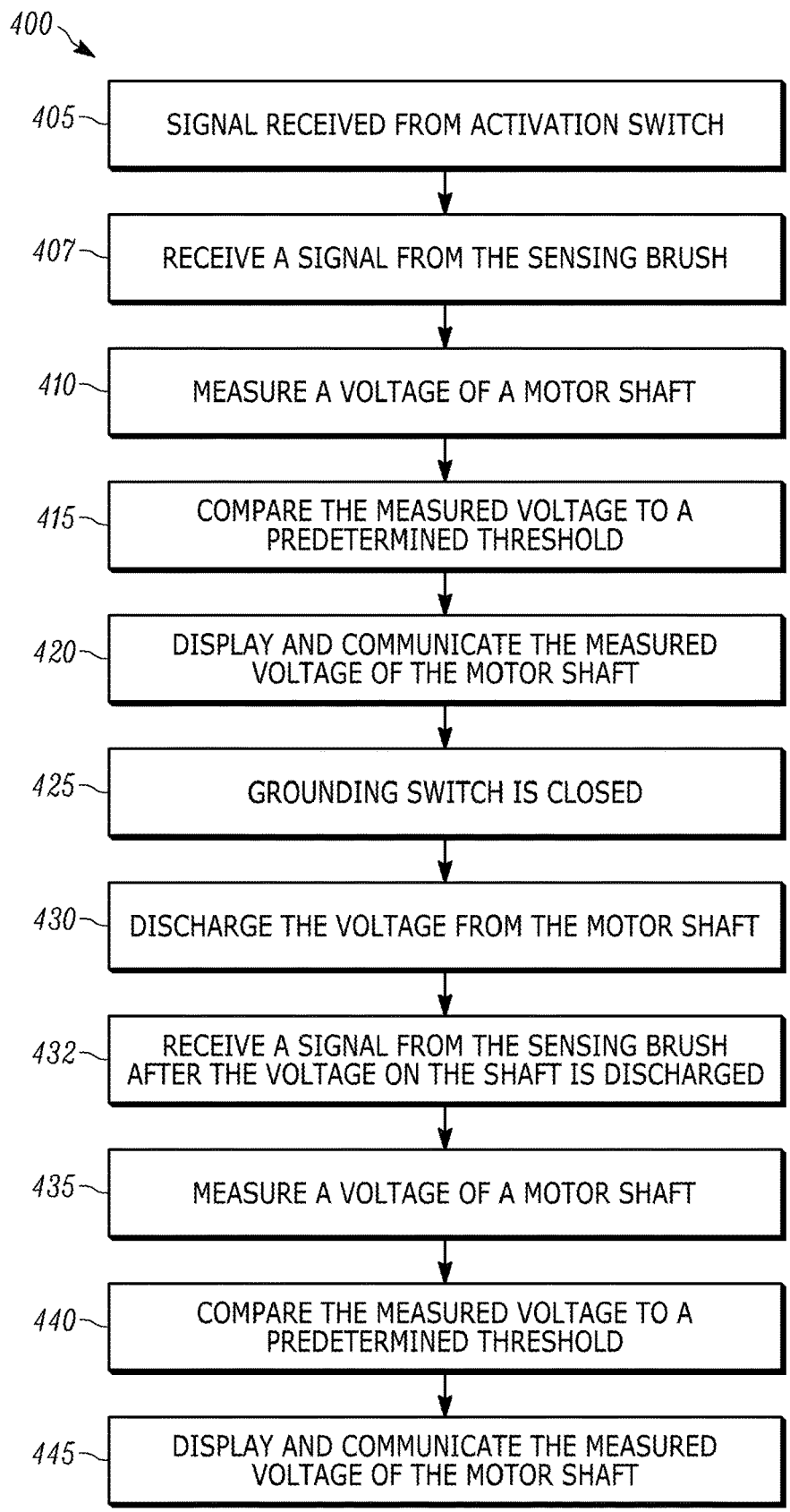
FIG. 4 illustrates a method for operating the voltage probe of FIG. 1.
Figure 5:
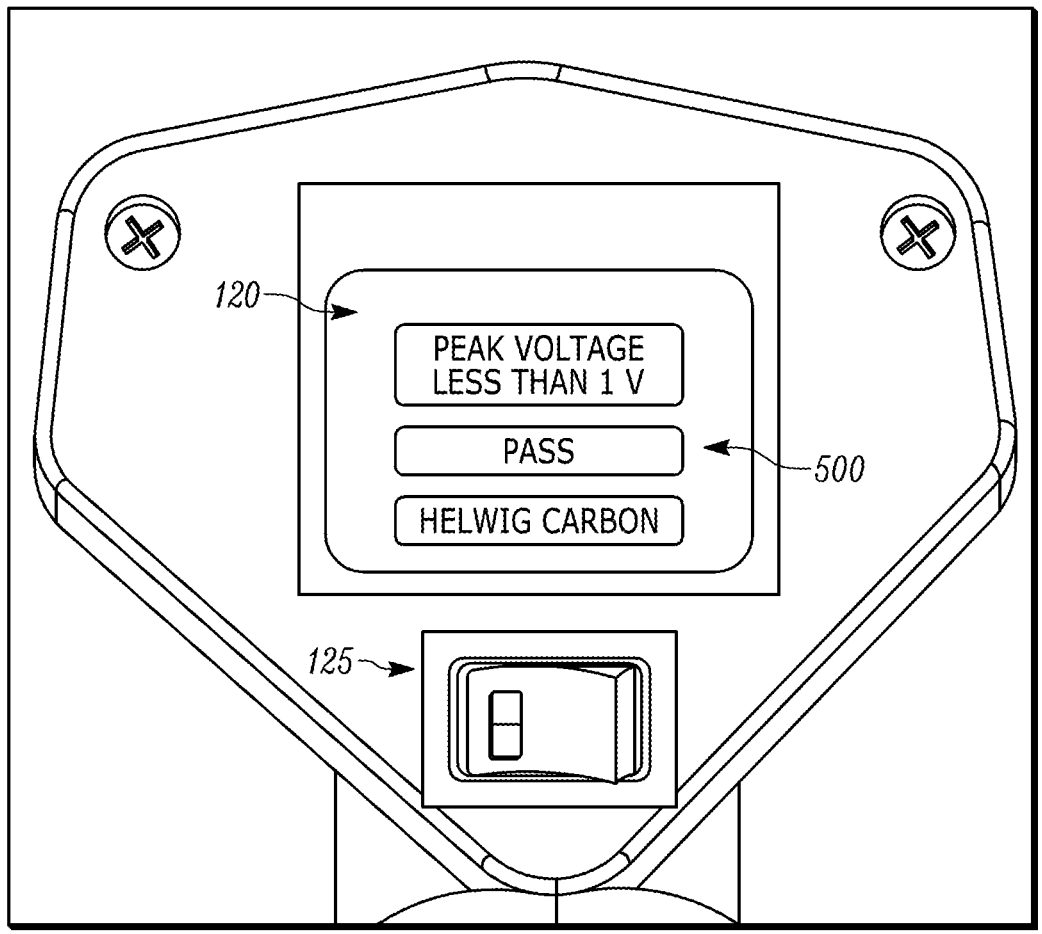
FIG. 5 illustrates an example of a message displayed on a display device included in the voltage probe of FIG. 1 when the voltage on the motor shaft is determined to be below a predetermined threshold.

FIG. 4 illustrates an example method 400 for operating the voltage probe 100. The method 400 begins when the electronic processor 300 receives an activation signal from the activation switch 140 (at block 405) and a signal from the sensing brush 145, via the signal processing circuitry 315 (at block 407). When the electronic processor 300 receives the activation signal, the electronic processor 300 is configured to measure the voltage on the motor shaft using the signal from the sensing brush 145 (at block 410). The electronic processor 300 is configured to compare the measured voltage on the motor shaft to a predetermined threshold (at block 415). In some embodiments, the electronic processor 300 generates an electronic signal indicative of the measured voltage or the comparison to transmit to the display device 120, transmit to an electronic device via the communication interface 310, or both (at block 420). When the display device 120 receives the electronic signal from the electronic processor 300, the display device 120 generates a visual indication that signifies whether the measured voltage is above, below, or equal to the predetermined threshold. An example of a visual indication 500 displayed by the display device 120 when the voltage on the motor shaft is below a predetermined threshold is shown in FIG. 5. When the grounding switch 125 is closed (the state of the grounding switch 125 changes) (at block 425), the grounding brush 150 connects the motor shaft to the ground of, for example, the motor and discharges voltage on the motor shaft (at block 430). After the grounding brush 150 discharges the motor shaft, the electronic processor 300 receives a signal from the sensing brush 145 via the signal processing circuitry 315 (at block 432) and measures the voltage on the motor shaft (at block 435). The electronic processor 300 compares the voltage measured after the motor shaft is discharged to a predetermined threshold (at block 440). In some embodiments, based on the results of the comparison, the electronic processor 300 generates an electronic signal indicative of the measured voltage or the comparison to transmit the display device 120, transmit to an electronic device via the communication interface 310, or both (at block 445). It should be noted that the electronic processor 300 may be configured to measure the voltage on the motor shaft multiple times regardless of whether the state of the grounding switch 125 changes.

It should also be noted that, in some embodiments, the electronic processor 300 does not compare the measured voltage to a predetermined threshold. In these embodiments, the visual indication displayed on the display device 120 is the measured voltage. For example, "4.5V" may be displayed on the display device 120.

Figure 6:
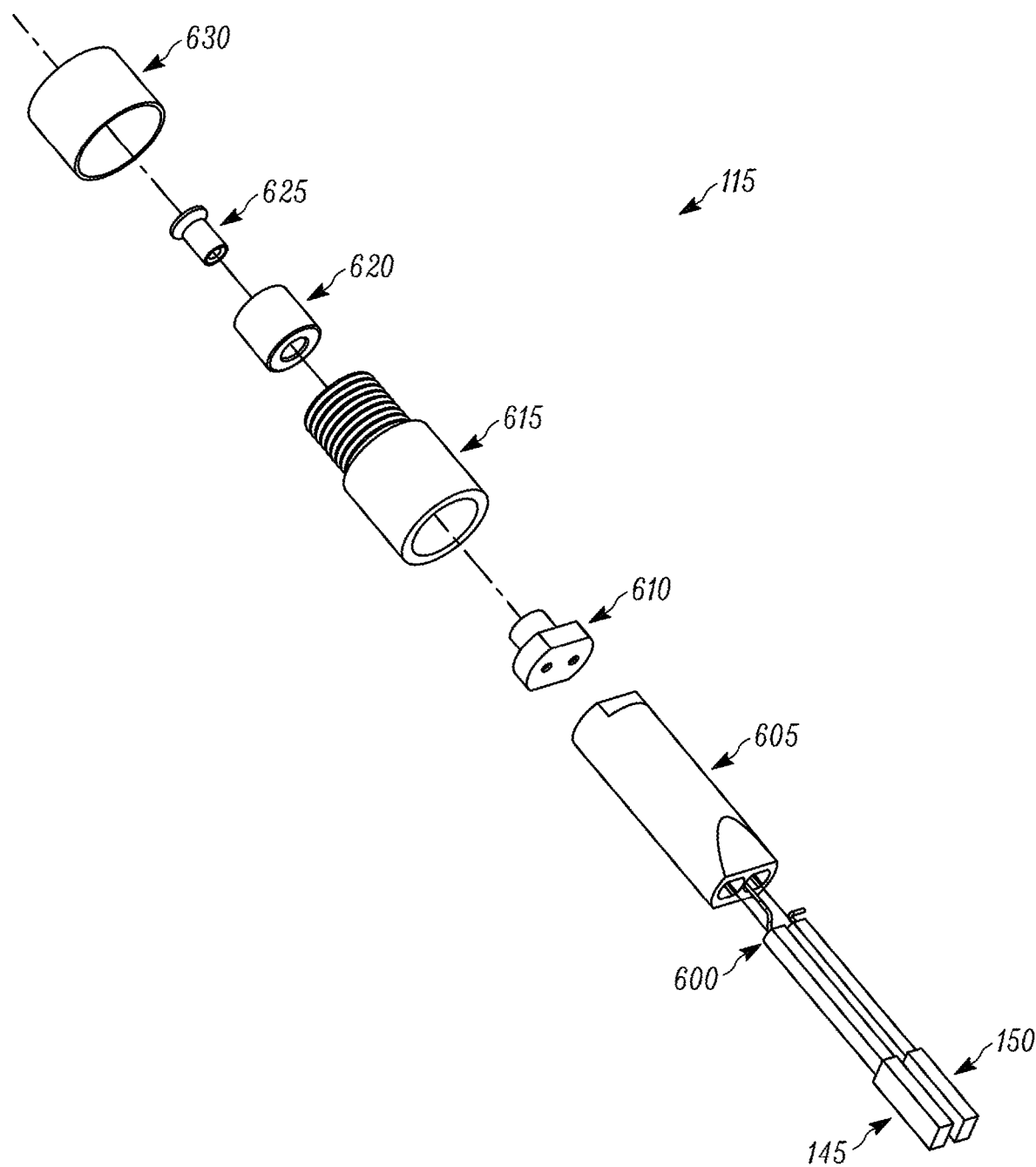
FIG. 6 illustrates an expanded view of the components of a typical brush tip of the voltage probe of FIG. 1.
Figure 7:
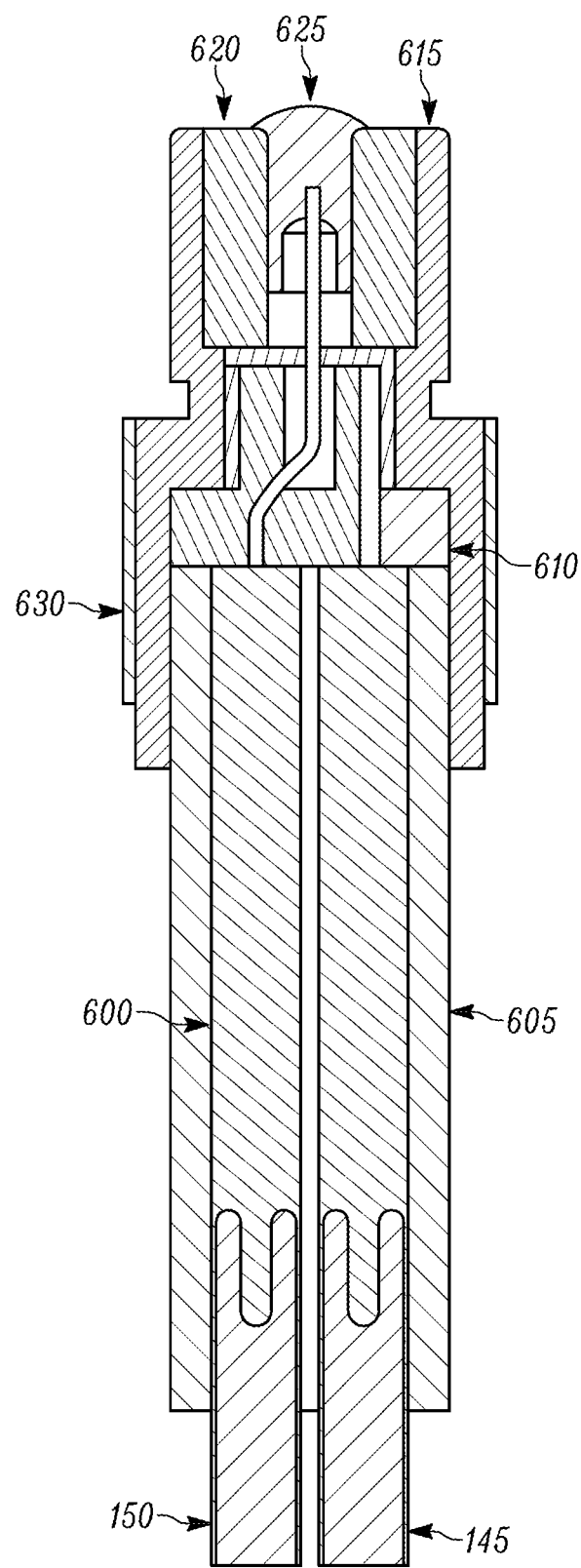
FIG. 7 illustrates a typical assembled brush tip included in the voltage probe of FIG. 1.

FIG. 6 illustrates one embodiment of an expanded view of the brush tip 115. In the illustrated embodiment, the brush tip 115 includes the sensing brush 145, the grounding brush 150, a spring 600, a brush housing 605, a wire guide 610, a connector 615, a spacer 620, a center contact 625, and tubing 630. The spring 600 allows the sensing brush 145 and the grounding brush 150 to move into the brush housing 605 when pushed against the motor shaft (or any other object with less give than the spring 600). The wire guide 610 holds the wires that extend from the sensing brush 145 and the grounding brush 150 in place. The connector 615 attaches the brush tip 115 to the extension tube 110. The center contact 625, spacer 620, and tubing 630 hold above identified components of the brush tip 115 together. FIG. 7 illustrates in cross-section an example of the brush tip 115 in its assembled form.

Figure 8:
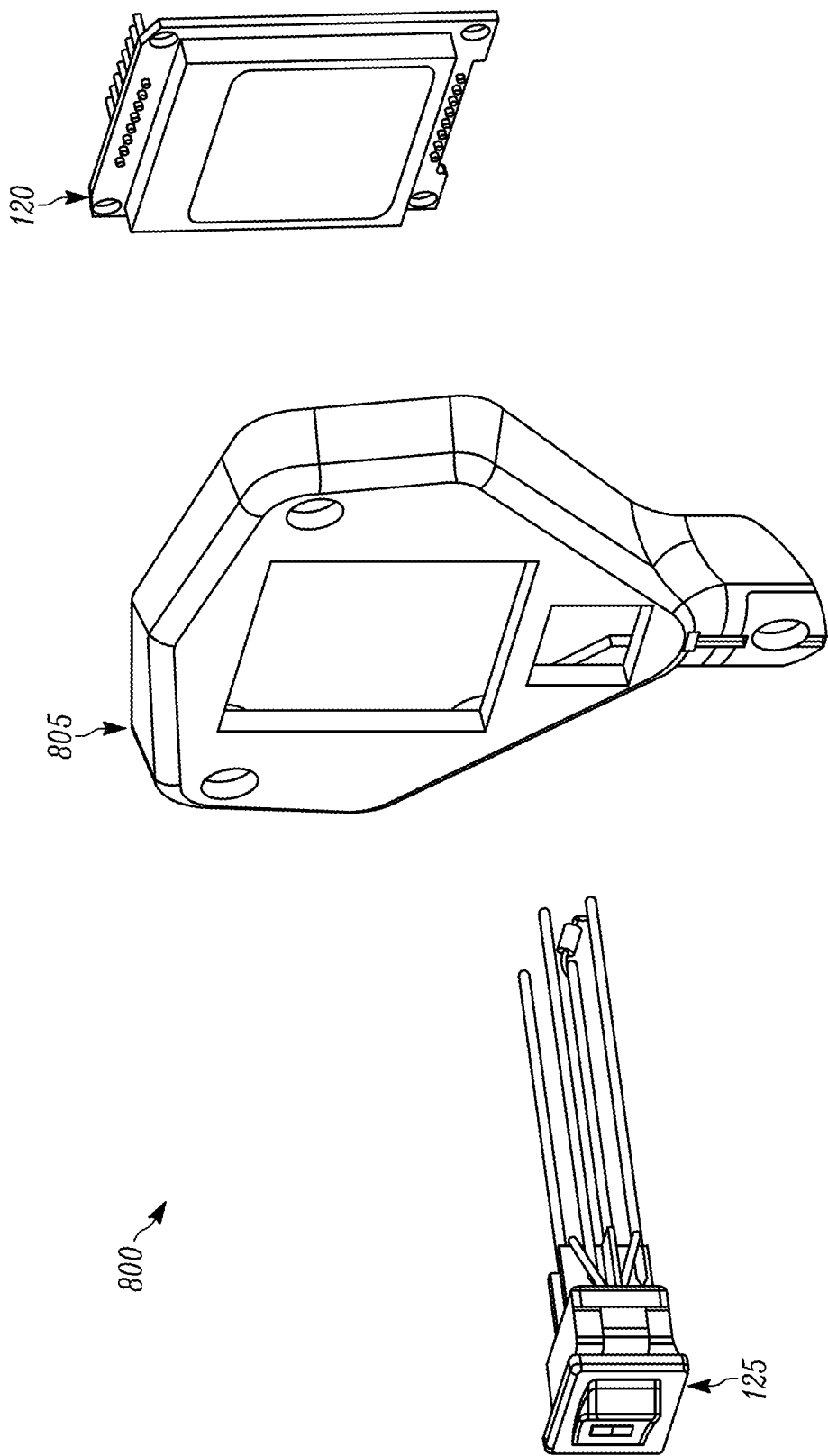
FIG. 8 illustrates an expanded view of the components of a face plate assembly of the voltage probe of FIG. 1.

FIG. 8 illustrates one example of an expanded view of the components of a face plate assembly 800 of the voltage probe handle 105. The face plate assembly 800 includes the display device 120, the grounding switch 125, and a face plate 805. In the illustrated embodiment, the display device 120 is connected to the face plate 805 via any suitable means.

Figure 9:
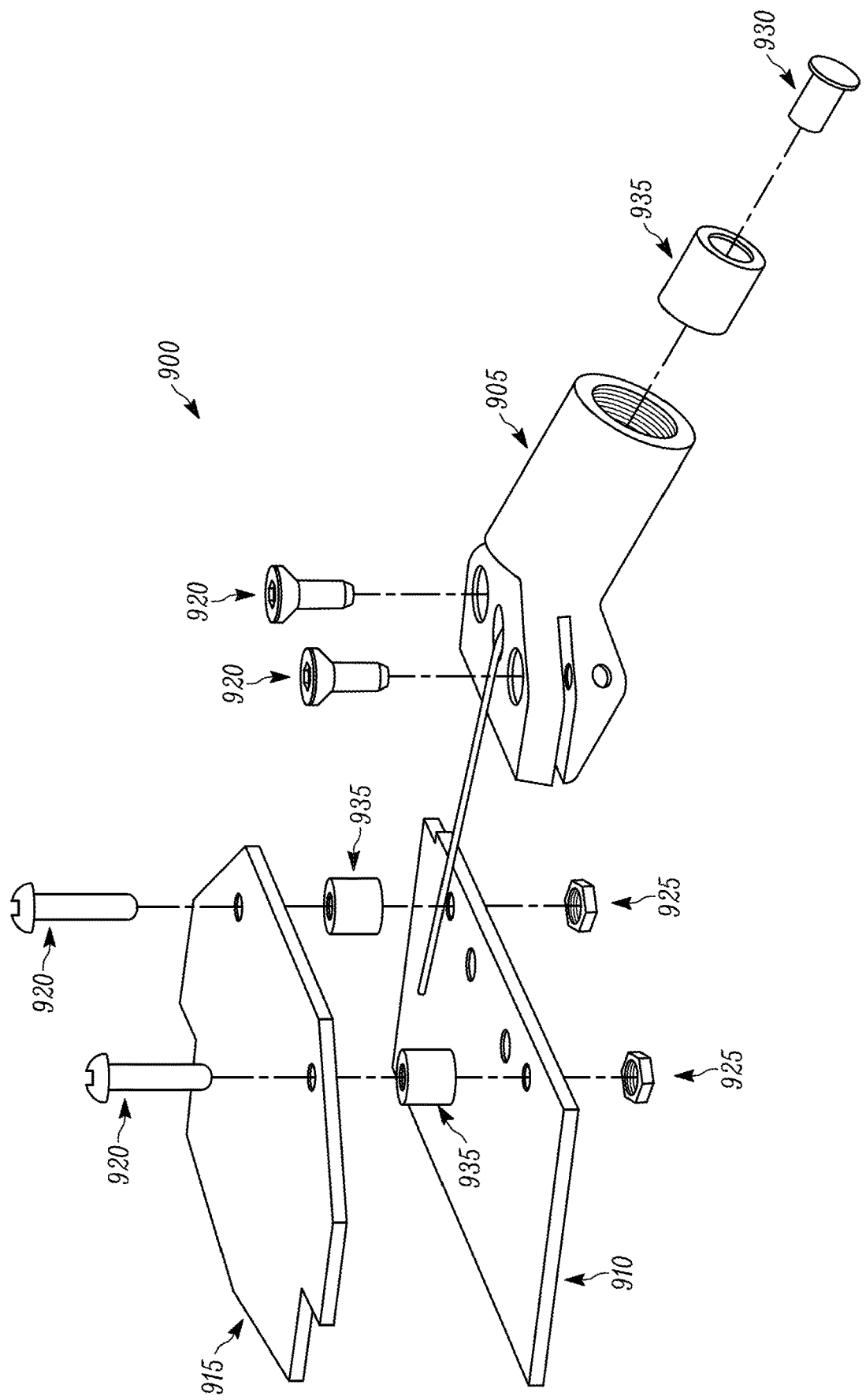
FIG. 9 illustrates an expanded view of the components of a connector assembly of the voltage probe of FIG. 1.

The face plate assembly 800 is connected to the extension tube 110 via a connector assembly such as the connector assembly 900 illustrated in FIG. 9. In the illustrated embodiment, the connector assembly 900 includes a connector 905, a plate 910, a circuit board 915 that includes the electronic processor 300, and a plurality of screws 920, nuts 925, center contact 930, spacers 935, and the like. Wires that connect to the sensing brush 145 and the grounding brush 150 are also illustrated in FIG. 9. It should be noted that the connector 905 of the connector assembly 900 may connect to the brush tip 115 or the extension tube 110.

Figure 10:
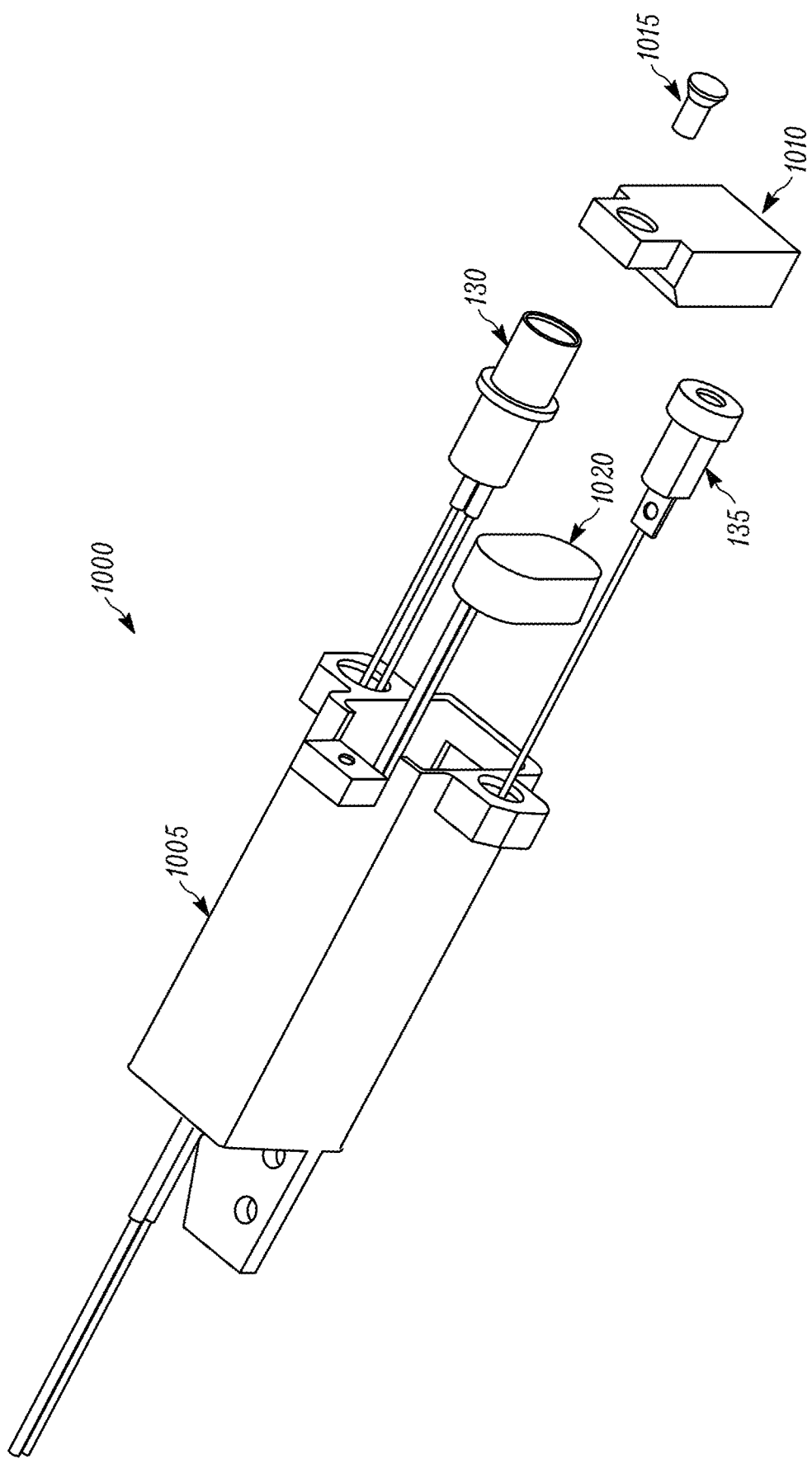
FIG. 10 illustrates an expanded view of the components of a battery container of the voltage probe of FIG. 1.
Figure 11:
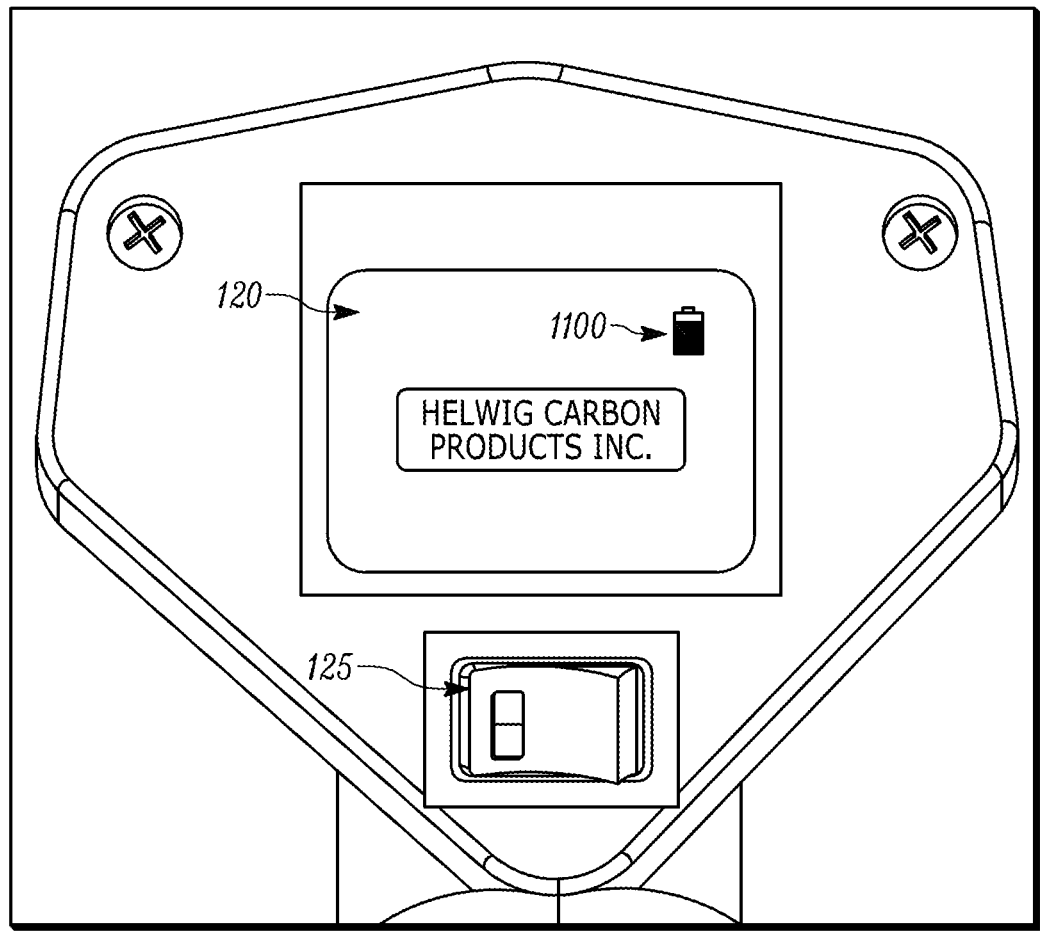
FIG. 11 illustrates an example of an icon displayed on a display device included in the voltage probe of FIG. 1 to indicate the charge held by a battery powering the voltage probe of FIG. 1.
Figure 12:
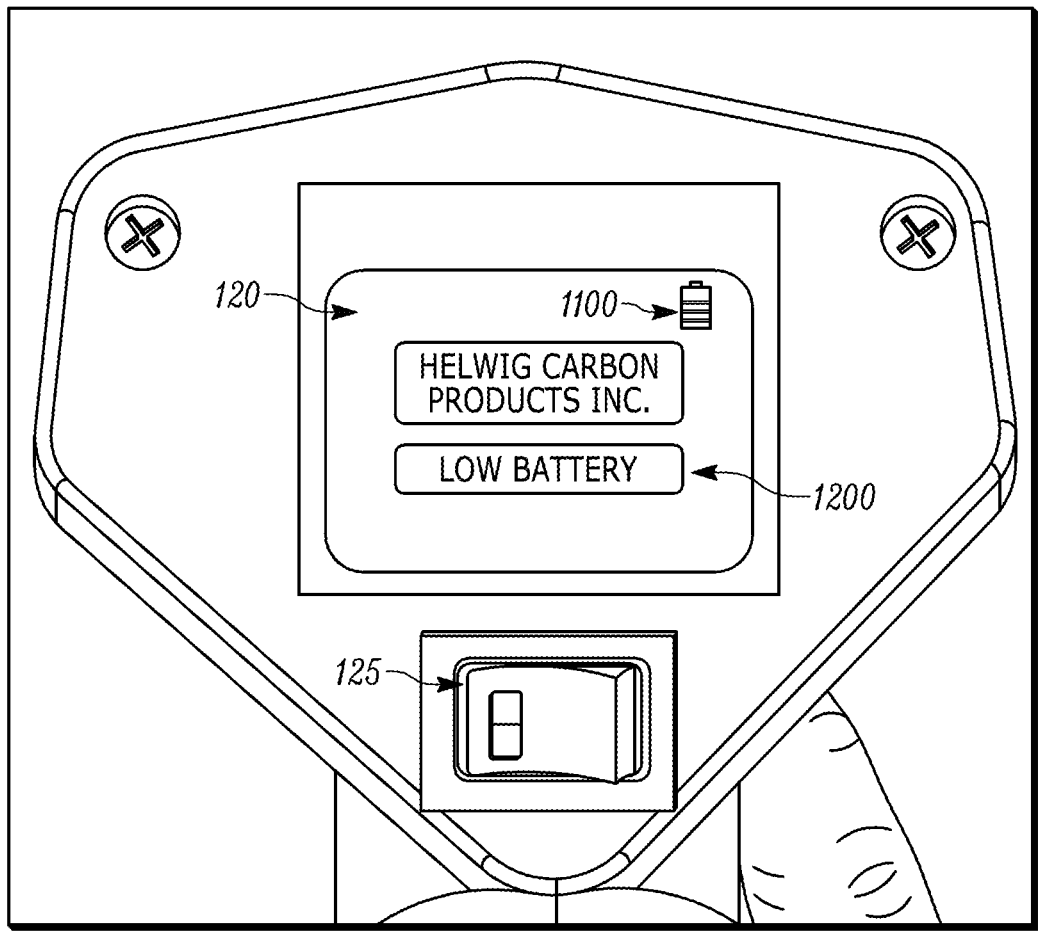
FIG. 12 illustrates an example of a message displayed on a display device included in the voltage probe of FIG. 1 when charge held by a battery powering the voltage probe of FIG. 1 is determined to be below a predetermined threshold.

In some embodiments, the voltage probe 100 is powered with a battery. The battery may be connected to the voltage probe 100 by means of a battery compartment such as the battery compartment 1000 illustrated in FIG. 10. In the illustrated embodiment, the battery compartment 1000 includes the BNC connector 130, the ground connector 135, a battery housing 1005, a battery housing cover 1010, a screw 1015 to hold the battery housing cover 1010 to the battery housing 1005, a battery strap 1020 to hold the battery in place, and the like. In some embodiments, the electronic processor 300 may be configured to determine the voltage of the battery and display, via the display device 120, a visual representation of the charge held by the battery. For example the icon 1100 in FIG. 11 is a visual representation of the battery's voltage according to one embodiment. In some embodiments, when the battery's voltage is below the level required to operate the voltage probe 100, the electronic processor 300 generates a low battery message that is displayed via the display device 120. FIG. 12 provides one example of a low battery message 1200 displayed via the display device 120. In some embodiments, the low battery message 1200 may flash periodically on the display device 120. In some embodiments, the electronic processor 300 may be configured to receive a signal to display the voltage of the battery when the activation switch 140 is pressed and released.

Figure 13:
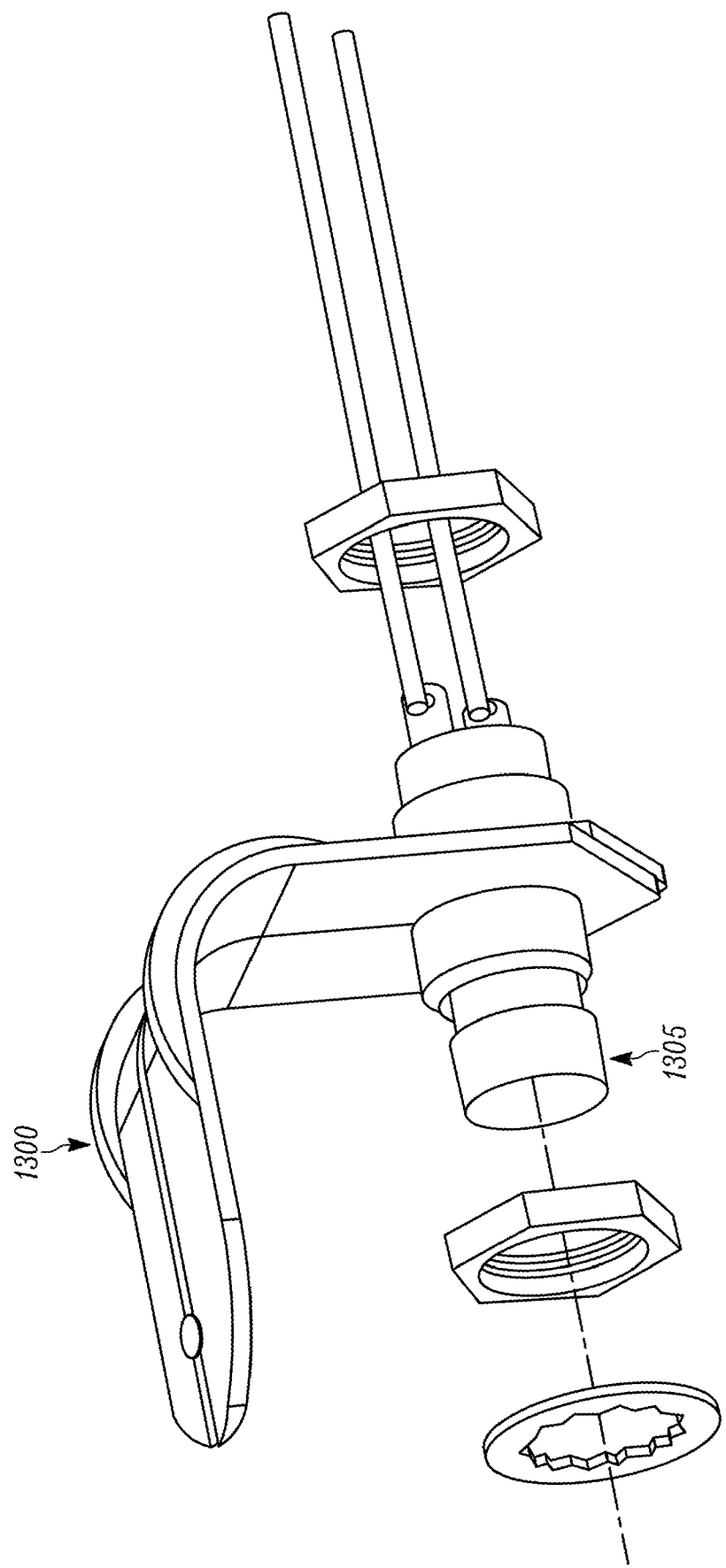
FIG. 13 illustrates an expanded view of the components of an activation switch of the voltage probe of FIG. 1.

FIG. 13 illustrates an example assembly of the activation switch 140. The activation switch 140 illustrated in FIG. 13 includes a switch plate 1300 and a SPST (single pole, single throw) switch 1305, and the like.

Figure 14:
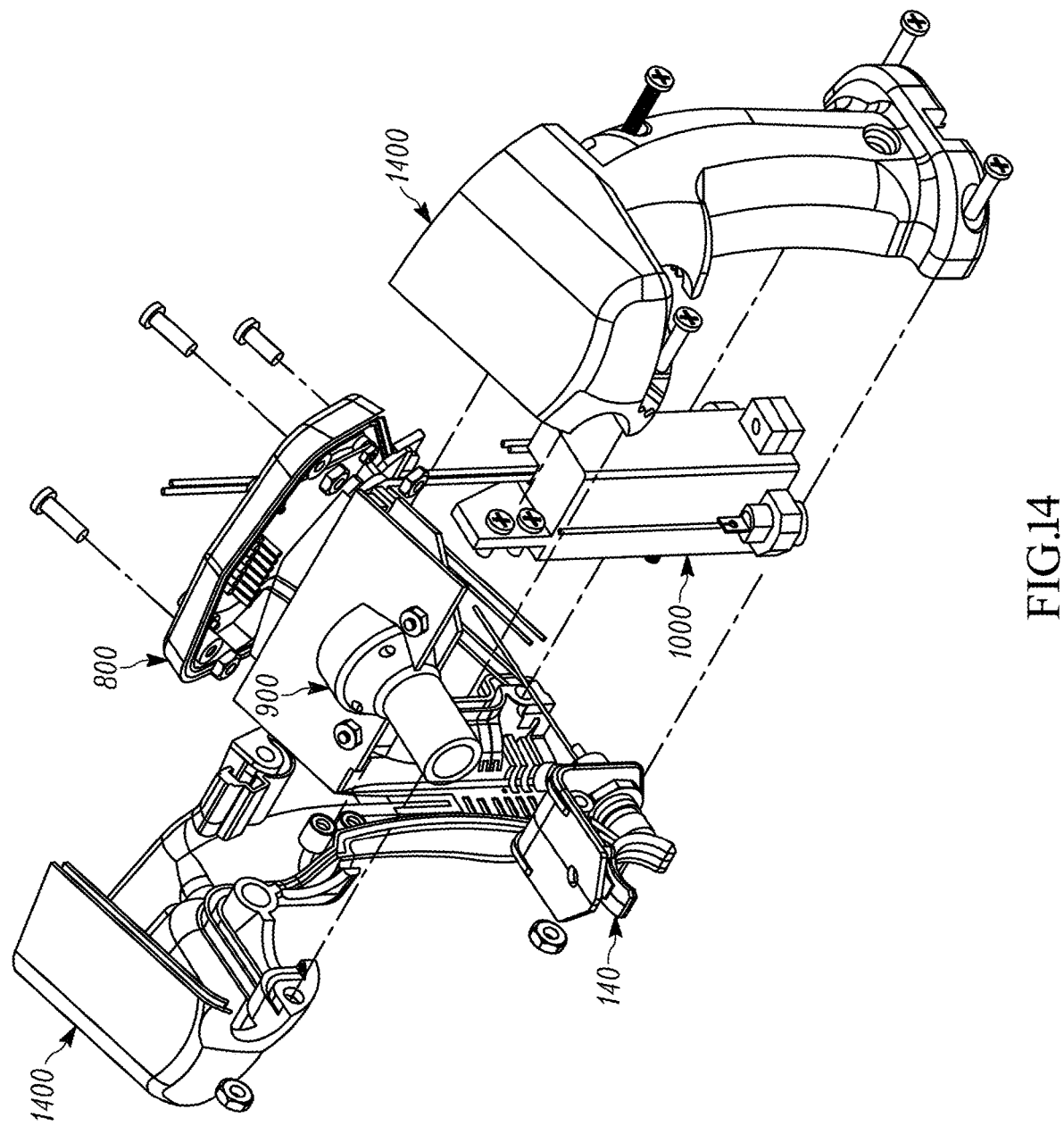
FIG. 14 illustrates an expanded view of the components of a voltage probe handle of the voltage probe of FIG. 1.

FIG. 14 illustrates an example an assembly of the voltage probe handle 105. In the example embodiment illustrated in FIG. 14, the voltage probe handle 105 includes, inside a voltage probe handle housing 1400, the face plate assembly 800, connector assembly 900, activation switch 140, and battery compartment 1000 via a plurality of screws and nuts.

Thus, the embodiments described herein provide, among other things, a voltage probe for measuring voltage on a mechanical device and simulating the effect that installing a bearing protection kit would have on the voltage of the mechanical device. Various features and advantages of the embodiments are set forth in the following claims.

What is claimed is:

1. A voltage probe, the voltage probe comprising,
   a ground connector configured to be coupled to an electrical ground;
   a sensing brush engagable with a mechanical device;
   a grounding brush engagable with the mechanical device;
   a grounding switch selectively coupling the grounding brush to an electric ground, wherein the grounding brush is electrically coupled to the electric ground when the grounding switch is closed, and wherein the grounding brush is decoupled from the electric ground when the grounding switch open; and
   an electronic processor, the electronic processor configured to,
      receive a first measured voltage from the sensing brush when the grounding switch is open,
      compare the first measured voltage to a predetermined threshold,
      generate an electronic signal indicative of the first measured voltage or the comparison,
      receive a second measured voltage from the sensing brush when the grounding switch closed, and
      generate an electronic signal indicative of the second measured voltage.

2. The voltage probe according to claim 1, wherein the electronic processor is configured to transmit the electronic signal to a display device to provide a visual indication of at least one selected from the group comprising of the first measured voltage, the second measured voltage, and the comparison.

3. The voltage probe according to claim 2, wherein the display device is a graphical user interface or one or more LEDs.

4. The voltage probe according to claim 2, wherein the visual indication signifies whether at least one of the first measured voltage and the second measured voltage is above, below, or equal to the predetermined threshold.

5. The voltage probe according to claim 1, wherein the grounding brush is configured to discharge the mechanical device when the grounding switch is closed.

6. The voltage probe according to claim 1, wherein the grounding brush simulates the effect of a bearing protector kit on the mechanical device.

7. The voltage probe according to claim 1, wherein the sensing brush is connected to a measurement device to measure at least one of the first measured voltage and the second measured voltage.

8. The voltage probe according to claim 7, wherein the measurement device is an oscilloscope and the voltage probe includes a BNC connector that allows the oscilloscope to connect to the sensing brush.

9. The voltage probe according to claim 1, wherein the electronic processor is configured to transmit the electronic signal to an electronic device via a communication interface included in the voltage probe.

10. The voltage probe according to claim 1, wherein the voltage probe provides an indication of whether the grounding switch is open or closed.

11. A method of using a voltage probe to measure voltage on a mechanical device, the method comprising:
   coupling a ground connector to an electrical ground;
   receiving, with an electronic processor, a first measured voltage from a sensing brush, the sensing brush engagable with the mechanical device;
   comparing, with the electronic processor, the first measured voltage to a predetermined threshold;
   generating, with the electronic processor, an electronic signal indicative of the first measured voltage or the comparison;
   adjusting a grounding switch from an open position to a closed position to electrically couple a grounding brush to the ground connector, the grounding brush engagable with the mechanical device, wherein the grounding brush is electrically coupled to the ground connector when the grounding switch is closed, and wherein the grounding brush is decoupled from the ground connector when the grounding switch open; and
   when the grounding switch is closed, discharging the mechanical device using the grounding brush and the ground connector.

12. The method according to claim 11, the method further comprising transmitting the electronic signal to a display device to provide a visual indication of the first measured voltage or the comparison.

13. The method according to claim 12, wherein the display device is a graphical user interface or one or more LEDs.

14. The method according to claim 11, wherein the visual indication signifies whether the first measured voltage is above, below, or equal to the predetermined threshold.

15. The method according to claim 11, wherein the grounding brush simulates the effect of a bearing protector kit on the mechanical device.

16. The method according to claim 11, the method further comprising:
   transmitting the electronic signal to an electronic device via a communication interface included in the voltage probe.

17. The method according to claim 11, method further comprising:
   indicating whether the grounding switch is open or closed.

18. The method according to claim 11, further comprising receiving, by the electronic processor, a second measured voltage from the sensing brush; and
   generating an electronic signal indicative of the second measured voltage.

19. A voltage probe, the voltage probe comprising,
   a sensing brush engagable with a mechanical device;
   a grounding brush engagable with the mechanical device;
   a grounding switch selectively coupling the grounding brush to an electric ground, wherein the grounding brush is electrically coupled to the electric ground when the grounding switch is closed, and wherein the grounding brush is decoupled from the electric ground when the grounding switch open; and
   an electronic processor, the electronic processor configured to,
      receive a first measured voltage from the sensing brush when the grounding switch is open,
      generates an electronic signal indicative of the first measured voltage,
      receive a second measured voltage from the sensing brush when the grounding switch closed, and generate an electronic signal indicative of the second measured voltage.

20. The voltage probe of claim 19, wherein the electronic processor is further configured to:
receive a second measured voltage from the sensing brush when the grounding switch closed, and
generate an electronic signal indicative of the second measured voltage.

\* \* \* \* \*